(12) United States Patent
Lhostis et al.

(10) Patent No.: US 9,449,896 B2
(45) Date of Patent: Sep. 20, 2016

(54) DEVICE COMPRISING A THREE-DIMENSIONAL INTEGRATED STRUCTURE WITH SIMPLIFIED THERMAL DISSIPATION, AND CORRESPONDING FABRICATION METHOD

(71) Applicants: STMICROELECTRONICS SA, Montrouge (FR); STMICROELECTRONICS (CROLLES 2) SAS, Crolles (FR)

(72) Inventors: Sandrine Lhostis, Theys (FR); Olga Kokshagina, Paris (FR); Yann Beilliard, La Tronche (FR); Vincent Fiori, Grenoble (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/590,404

(22) Filed: Jan. 6, 2015

(65) Prior Publication Data
US 2015/0200151 A1     Jul. 16, 2015

(30) Foreign Application Priority Data

Jan. 13, 2014   (FR) .................................... 14 50230

(51) Int. Cl.
*H01L 23/31*     (2006.01)
*H01L 23/473*    (2006.01)
(Continued)

(52) U.S. Cl.
CPC ............. *H01L 23/473* (2013.01); *H01L 21/56* (2013.01); *H01L 23/31* (2013.01); *H01L 23/3121* (2013.01); *H01L 25/0657* (2013.01); *H01L 23/3135* (2013.01); *H01L 24/16* (2013.01); *H01L 24/17* (2013.01); *H01L 24/32* (2013.01); *H01L 24/73* (2013.01); *H01L 25/18* (2013.01); *H01L 2224/16145* (2013.01); *H01L 2224/16225* (2013.01); *H01L 2224/1703* (2013.01);
(Continued)

(58) Field of Classification Search
CPC ....... H01L 23/31; H01L 23/42; H01L 23/44; H01L 23/46; H01L 23/473; H01L 21/50; H01L 21/56
See application file for complete search history.

(56) References Cited

U.S. PATENT DOCUMENTS

| 7,990,711 B1 | 8/2011 | Andry |
| 2004/0251530 A1 | 12/2004 | Yamaji |

(Continued)

FOREIGN PATENT DOCUMENTS

| EP | 1460688 A2 | 9/2004 |
| JP | H0428258 A | 1/1992 |
| JP | H10261748 A | 9/1998 |

OTHER PUBLICATIONS

C. Fu, et al., "A novel and simple fabrication method of embedded SU-8 micro channels by direct UV lithography," 2006, Journal of Physics: conference series 34, 330-5, pp. 1-6.
(Continued)

*Primary Examiner* — Kyoung Lee
(74) *Attorney, Agent, or Firm* — Allen, Dyer, Doppelt, Milbrath & Gilchrist, P.A.

(57) ABSTRACT

A device includes a support, a three-dimensional integrated structure above the support, and a lateral encapsulation region arranged around the structure. The lateral encapsulation region includes first channels configured to make it possible to circulate a cooling fluid.

28 Claims, 9 Drawing Sheets

(51) Int. Cl.
  *H01L 21/56* (2006.01)
  *H01L 25/065* (2006.01)
  *H01L 23/00* (2006.01)
  *H01L 25/18* (2006.01)

(52) U.S. Cl.
  CPC .......... *H01L2224/17181* (2013.01); *H01L 2224/32225* (2013.01); *H01L 2224/73204* (2013.01); *H01L 2224/73253* (2013.01); *H01L 2225/06513* (2013.01); *H01L 2225/06517* (2013.01); *H01L 2225/06555* (2013.01); *H01L 2225/06589* (2013.01); *H01L 2924/1431* (2013.01); *H01L 2924/1434* (2013.01); *H01L 2924/167* (2013.01); *H01L 2924/16195* (2013.01); *H01L 2924/1815* (2013.01); *H01L 2924/18161* (2013.01)

(56) References Cited

U.S. PATENT DOCUMENTS

| | | |
|---|---|---|
| 2005/0104027 A1 | 5/2005 | Lazarev |
| 2007/0085198 A1 | 4/2007 | Shi |
| 2009/0072332 A1 | 3/2009 | Dekker |
| 2009/0087640 A1 | 4/2009 | Li |
| 2009/0294954 A1 | 12/2009 | Bakir |
| 2010/0052157 A1 | 3/2010 | Pratt |
| 2012/0061059 A1* | 3/2012 | Hsiao ............... F28D 15/02 165/104.33 |

OTHER PUBLICATIONS

Van Thanh Dau et al., "A MEMS-based silicon micropump with intersecting channels and integrated hotwires," Journal of Micromechanics and Microengineering vol. 19 No. 12, 2009), p. 1 (Abstract).

D. J. Laser et al., "A review of micropumps," Department of Mechanical Engineering, Stanford University, Stanford, CA, Apr. 19, 2004, pp. 1-30.

Sabry, et al, "Energy-Efficient Multiobjective Thermal Control for Liquid-Cooled 3D Stacked Architectures", IEEE Transactions on Coumputer-Aided Design of Integrated Circuits and Systems, vol. 30, No. 12, Dec. 2011, pp. 1883-1896.

Dang et al., "Integrated Microfluidic Cooling and Interconnects for 2D and3D Chips", IEE Transactions on Advanced Packaging, vol. 33, No. 1, Feb. 2010, pp. 79-87.

* cited by examiner

DEVICE COMPRISING A THREE-DIMENSIONAL INTEGRATED STRUCTURE WITH SIMPLIFIED THERMAL DISSIPATION, AND CORRESPONDING FABRICATION METHOD

FIELD OF THE INVENTION

Embodiments of the invention relate to three-dimensional integrated structures, in particular to the dissipation of heat within three-dimensional integrated structures, and more particularly to the dissipation of heat by circulation of a fluid.

BACKGROUND

A three-dimensional integrated structure may comprise a plurality of stacked integrated circuits, for example, circuits comprising logic functions and memory circuits. During operation, the three-dimensional integrated structures are subject to temperature rises, and dissipation of the heat is complex to carry out within such structures.

It has therefore been proposed to improve the dissipation of heat within three-dimensional integrated structures. It has also been proposed to circulate a fluid for cooling the three-dimensional integrated structures by convection.

Reference may be made to Published U.S. Patent Application No. 2009/0294954, which describes an integrated-circuit stack in which fluidic connections (vias) pass through all the integrated circuits of the stack in order to circulate a fluid therein and remove heat. Published U.S. Patent Application No. 2009/0072332 describes the formation of channels in semiconductor substrates in order to cool an integrated circuit.

Published U.S. Patent Application No. 2007/0085198 describes the assembly of a substrate comprising a network of channels which are arranged between two integrated circuits in order to cool them. Lastly, Published U.S. Patent Application No. 2005/0104027 describes the integration of dissipaters inside an integrated structure.

These prior art approaches may have the drawback of being complex to implement, and may make it necessary to carry out steps of modifying the structure of the integrated circuits, with the cooling channels being placed directly in the integrated circuits.

SUMMARY

According to one embodiment, it is proposed to dissipate the heat within a three-dimensional integrated structure more simply.

One aspect provides a device comprising a support, a three-dimensional integrated structure above the support, and a lateral encapsulation region arranged around the structure. According to a general characteristic of this aspect, the lateral encapsulation region comprises first channels configured in order to make it possible to circulate a cooling fluid.

Thus, whereas in the prior art it the channels are directly formed within the integrated circuits forming a three-dimensional integrated structure, it has been observed by the inventors that it is simpler to form channels in the lateral encapsulation region, for example, comprising a resin, which surrounds the integrated circuits of an integrated structure. This is because the integrated circuits are generally assembled on supports, for example intermediate supports (interposers) or printed-circuit boards, then encapsulated in the encapsulation region. Thus, no modification of the integrated circuits which form a three-dimensional integrated structure may be necessary. Furthermore, good dissipation of the heat is obtained by forming channels in the lateral region.

The device may furthermore comprise a pump in fluid communication with the first channels. The use of a pump can make it possible to implement at least one closed fluidic circulation circuit, in which water that has been cooled is injected into an entry of the first channels and hotter water is ejected at at least one exit of the first channels.

The device may furthermore comprise a cap above the three-dimensional integrated structure, the cap comprising second channels in fluidic communication with the said first channels. The use of a cap makes it possible to seal in a simple way channels extending from the upper part of the lateral region. Furthermore, by using second channels which are arranged above the integrated structure, heat can be exchanged with a thermal dissipation structure which is fitted above the cap, so as to cool the fluid which will be reinjected into the first channels.

The pump may be in fluid communication with the first channels through the second channels, and the pump may be arranged above the cap. An assembly with small dimensions is thus obtained, which is simple to produce since the pump which is placed on the cap communicates with the second channels of this cap, which will subsequently inject water cooled by the second channels into the first channels and thus recover the hot water. The pump may, for example, be connected to the second channels at a central point of the fluidic circuit formed by the first and the second channels.

The cap may comprise a lower cap layer and an upper cap layer, which are assembled along an interface. The lower cap layer may comprise fluid connections, which pass the lower cap layer, and are located above portions of the first channels and communicate with the second channels. The second channels may extend in the lower cap layer from the interface between the lower cap layer and the upper cap layer.

The cap can thus be formed easily by steps of etching in two substrates, which are subsequently assembled, in order to communicate with entry and exit points of the first channels. The use of such a cap furthermore makes it possible to simplify the formation of the first channels, which may extend as far as the cap over their entire length, but for which the entry and the exit are integrated only in the cap.

The second channels may form a serpentine shape in order to increase the surface area of thermal exchange with a thermal dissipater mounted above. A good exchange surface area is thus obtained for cooling the fluid in the second channels of the cap.

The first channels may comprise buried horizontal subchannels and vertical subchannels. The cap may furthermore comprise connecting channels between vertical channels, with the assembly formed by the buried horizontal subchannels, the vertical subchannels and the connecting channels forming serpentine shapes.

The serpentine shapes obtained between the first channels (buried horizontal subchannels and the vertical channels) and the connecting channels are vertical and extend around the integrated structures. Better thermal transfer of the heat of the integrated circuits to the channels, which can be adapted to pass in front of hot points of the integrated circuits, is thus obtained.

The three-dimensional integrated structure may comprise a plurality of stacked integrated circuits, and the buried horizontal subchannels may comprise at least one buried horizontal subchannel extending in front of one of the integrated circuits and at least one buried horizontal subchannel extending in front of another of the integrated circuits.

Thus, the cooling can be improved by passing the channels as close as possible to the integrated circuits to be cooled, and, more particularly, the hottest points of these integrated circuits.

As a variant, the first channels may comprise one buried horizontal subchannel and vertical subchannels, the cap furthermore comprising a connecting channel between all the vertical channels. The buried subchannel thus extends around the integrated structure between an entry point and an exit point, and the connecting channel follows a similar path to the buried subchannel but it is arranged above, the vertical subchannels connecting them together. An even larger thermal exchange surface area is thus obtained, and the buried subchannel can be configured in order to pass it in front of hot points of the integrated circuits.

The lateral encapsulation region may comprise at least two superimposed resin regions. The formation of two superimposed resin regions can make it possible to form the buried subchannels in a simple way, by forming them in a lower resin then covering this lower resin with a nonconformal upper resin leaving the buried subchannels open, and finally forming the vertical subchannels in the upper resin.

The device may furthermore comprise a membrane between the at least two superimposed resin regions. The membrane can make it possible to use a conformal resin. The membrane may, for example, be a film having the reference "HQ-6100", marketed by the company "Etertec", or a film having the reference "SY-300/500", marketed by the company "ODYL".

The resin region which lies above at least one other resin region may comprise an SU-8 resin. This resin, in particular marketed by the US company MICROCHEM, is a negative photosensitive resin comprising, for example, a composition including epoxy resin (EPON SU-8), organic solvent and a photoinitiator, such as a triarylium-sulphonium salt. An SU-8 resin can be polymerized after first exposure to near ultraviolet in order to delimit first vertical channels then, after exposure to far UV, buried subchannels may be formed by polymerizing only a region lying above the buried subchannels.

Such a mechanism is described in the document "A novel and simple fabrication method of embedded SU-8 micro channels by direct UV lithography" (Fu C, Hung C, Huang H, 2006, Journal of Physics: conference series 34, 330-5).

Another aspect provides a method for producing a device, comprising formation of a lateral encapsulation region around an integrated structure located above a support. According to a general characteristic of this aspect, first channels are formed in order to make it possible to circulate a cooling fluid in the lateral encapsulation region. The first channels may be formed by an integrated-circuit cutting saw. The use of a cutting saw is very simple and does not require photolithography steps to be carried out.

The formation of the lateral encapsulation region may comprise at least two formations of superimposed resin regions. A membrane may be deposited between the at least two superimposed resin regions. The resin region which lies above at least one other resin region may comprise an SU-8 resin. Two exposures of the resin may be carried out at different wavelengths.

BRIEF DESCRIPTION OF THE DRAWINGS

Other advantages and characteristics of the invention will become apparent on studying the detailed description of embodiments, taken by way of nonlimiting examples and illustrated by the appended drawings, in which.

DETAILED DESCRIPTION

Figure 1:
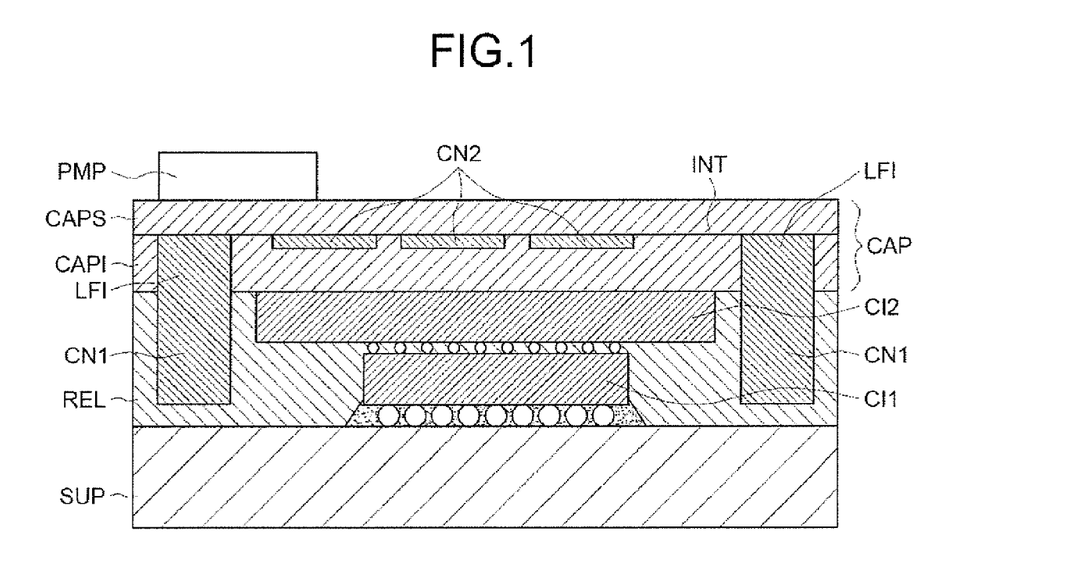
FIGS. 1 to 3 illustrate one embodiment of a device according to the invention.

FIG. 1 represents a view in section of a device comprising a support SUP, for example, an intermediate layer of the "interposer" type or a printed-circuit board, or alternatively a support with a matrix of connection beads, above which two integrated circuits CI1 and CI2 have been fixed in order to form a three-dimensional integrated structure, CI2 being arranged above CI1. By way of indication, the integrated circuit CI1 may comprise logic circuits and the integrated circuit CI2 may comprise memory circuits.

The embodiments are nevertheless in no way limited to assemblies of two integrated circuits, and may relate to any type of three-dimensional integrated structure.

An encapsulation region has been formed, for example, from resin, and its lateral part, the lateral encapsulation region REL, remains around the three-dimensional integrated structure. It is in this lateral encapsulation region REL that channels will be formed in order to improve the thermal dissipation of the three-dimensional integrated structure.

In the example of FIG. 1, first channels CN1 have been formed in the lateral encapsulation region REL. These first channels CN1 have a rectangular cross section in the section plane represented in FIG. 1, with a width of the order of 10 to 500 micrometers, and they surround the three-dimensional integrated structure comprising the integrated circuits CI1 and CI2 in order to improve the dissipation of heat by convection of a fluid in the channels.

A cap CAP has been assembled above the three-dimensional integrated structure and above the lateral encapsulation region REL.

The cap CAP comprises a lower cap layer CAPI and an upper cap layer CAPS, which are assembled along an interface INT. The lower and upper cap layers CAPI and CAPS may be made of silicon, in order to obtain good thermal dissipation.

In order to inject a fluid at a point of the first channels CN1 and make this fluid emerge (heated) at another point of the first channels CN1, fluidic connections LFI passing through the lower cap layer have been formed in the lower cap layer CAPI, above the portions of first channels CN1 which can be seen in FIG. 1. It may, however, be noted that it is not necessary to place these fluidic connections LFI at any point above the first channels CN1.

In order to cool the fluid which emerges from the first channels CN1, and which is reintroduced into the first channels CN1, second channels CN2 have been formed in the lower cap layer CAPI. The second channels CN2 extend in the lower cap layer CAPI from the interface INT between the lower cap layer CAPI and the upper cap layer CAPS. In other words, the upper cap layer CAPS seals the second channels CN2. The second channels CN2 may communicate with the first channels CN1 through the second channels, which communicate fluidically with the fluid connections LFI.

The device illustrated in FIG. 1 furthermore comprises a pump PMP, which can be set in communication with the second channels through the upper cap layer CAPS.

The person skilled in the art will know how to select a pump as a function of the application. By way of indication, it is in particular possible to produce pumps used for the injection of medicaments, or alternatively pumps formed in silicon, such as those described in the document "A MEMS-based silicon micropump with intersecting channels and integrated hotwires" (Van Thanh Dau et al., Journal of Micromechanics and Microengineering Volume 19 Number 12, 2009).

Figure 2:
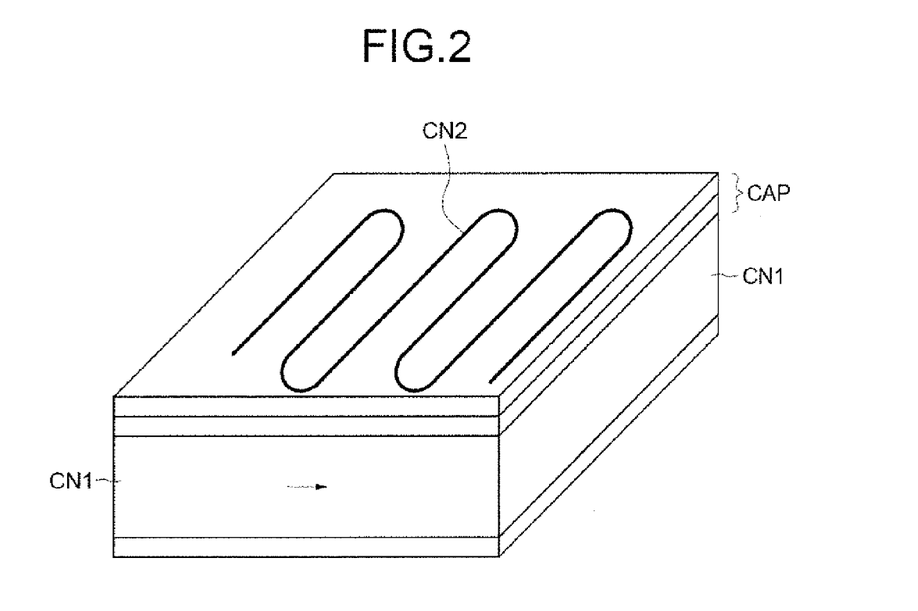

FIG. 2 is a perspective view of the device of FIG. 1, in which one of the first channels CN1 which surround the three-dimensional integrated structure can be seen. The flow direction of the fluid through the first channels CN1 has been represented by an arrow in this figure.

As can be seen in this FIG. 2, the second channels CN2 may form a serpentine path or shape, which facilitates the transfer of heat. It may be noted that heat dissipation means or a heat sink may be assembled above the cap CAP (or above the cap and a pump). It is therefore above the three-dimensional integrated structure that the fluid which flows through the various channels is cooled.

Figure 3:
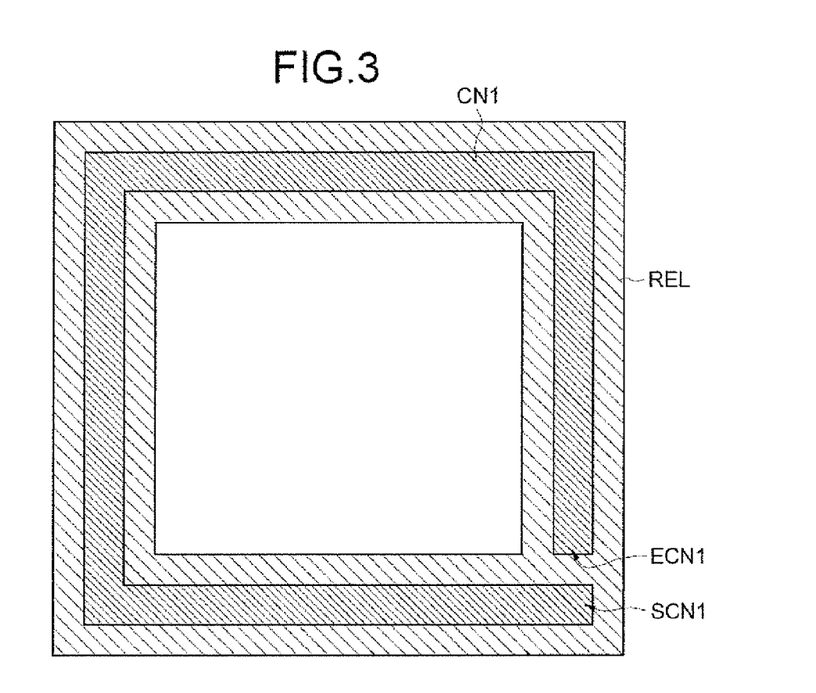

FIG. 3 represents a plan view of the path of the first channels CN1 in the lateral encapsulation region REL. This path extends between an entry point ECN1 of the first channels and an exit point SCN1 of the first channels. It is at least above the entry and exit points ECN1 and SCN1 of the first channels that it is suitable to place the fluidic connections LF1 in the lower cap layer CAPI.

Figure 4:
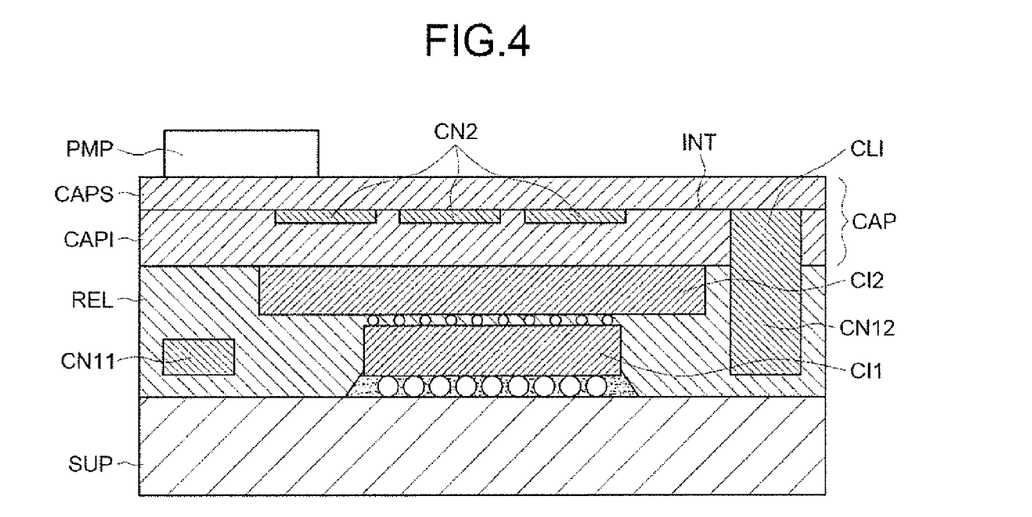
FIGS. 4 to 8 illustrate two other embodiments of devices according to the invention.

FIG. 4 represents a variant, in which the first channels comprise horizontal subchannels CN11 buried in the lateral encapsulation region REL, and vertical subchannels CN12. The vertical subchannels are connected together by connecting channels CL1 formed in the lower cap layer CAPI of the cap CAP.

Figure 5:
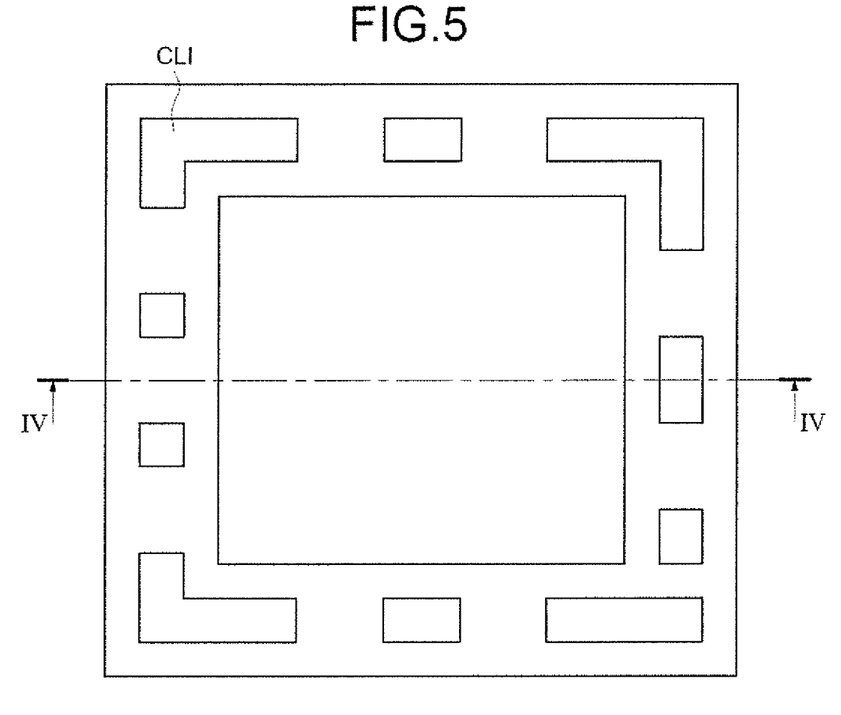

FIG. 5 is a plan view, passing through a plane lying in the lower cap layer CAPI, on which the path of the connecting channels that connect the vertical subchannels of FIG. 4 can be seen. FIG. 4 is a view in section passing through the axis IV-IV of FIG. 5.

Figure 6:
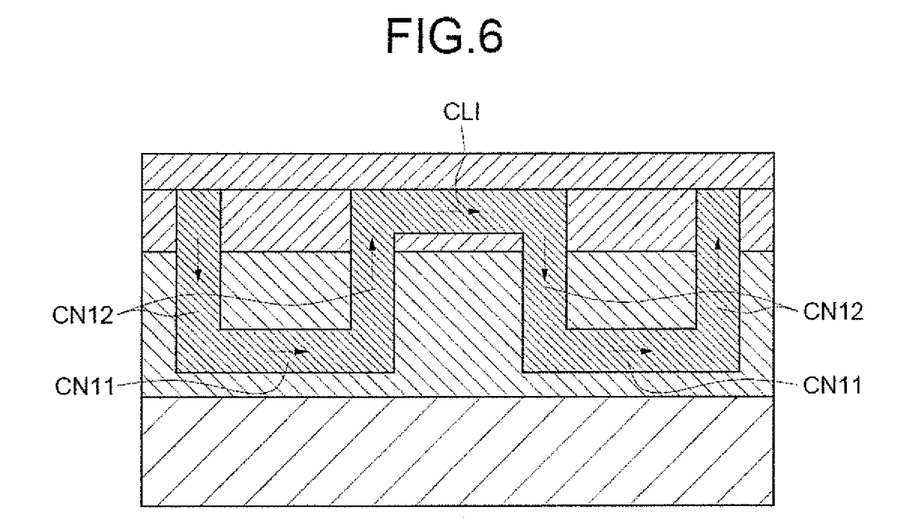

FIG. 6 represents a view in section and from the side of the device, on which the buried horizontal subchannels CN11, the vertical subchannels CN12 and the connecting channels CLI can be seen. A serpentine path, which surrounds the three-dimensional integrated structure, is obtained.

Figure 7:
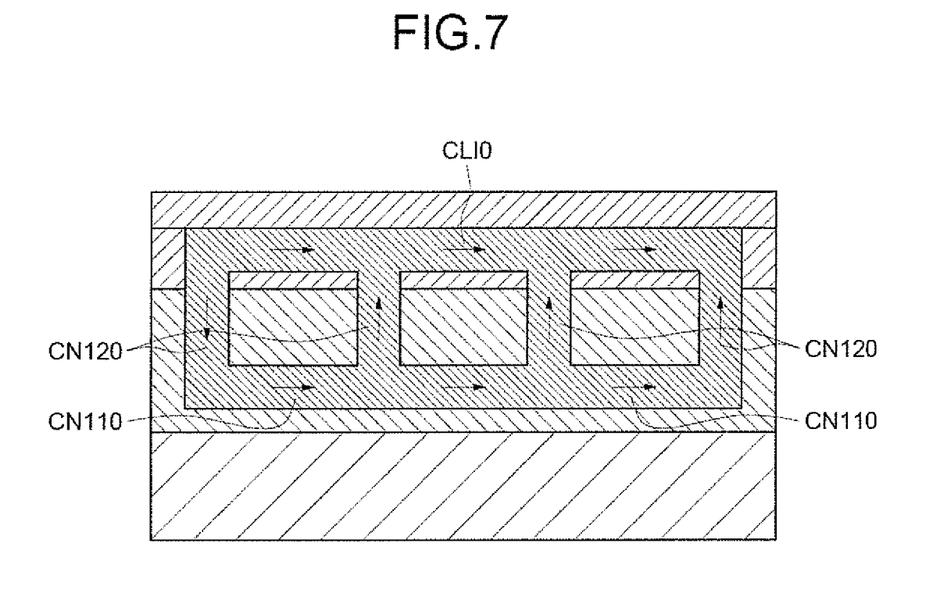

FIG. 7 is another variant, in which the first channels comprise one buried horizontal subchannel CN110 and vertical subchannels CN120, and the cap comprises one connecting channel CLI0 between all the vertical channels. This variant makes it possible to obtain good circulation of the fluid and a large thermal exchange surface area.

Figure 8:
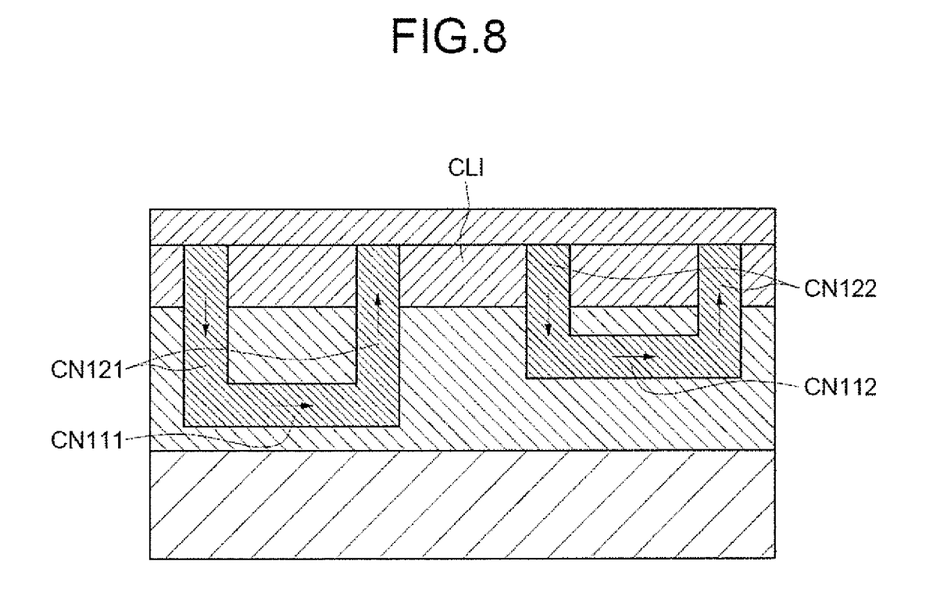

FIG. 8 is another variant, in which the first channels comprise a first group of first channels CN121 and CN111, forming a first circuit, and a second group of first channels CN122 and CN112, forming a second circuit.

The two circuits obtained are separate cooling circuits. In other words, these circuits can receive a cooled fluid at their entry, and their exit delivers a hotter fluid and communicates, for example, with the second channels (for cooling them). A fluid which has recovered heat at a point of the integrated structure will therefore not circulate directly in a second cooling circuit intended to recover heat at a second point of the integrated structure. In other words, the exit of the first circuit does not form the entry of the second circuit, because a fluidic linking circuit is provided between the two circuits.

In FIG. 8, the horizontal subchannel CN111 extends, for example, in front of one of the integrated circuits of the three-dimensional integrated structure, for example, the lowest integrated circuit. The vertical subchannels CN121 therefore extend deeply.

The horizontal subchannel CN112 extends, for example, in front of an integrated circuit of the three-dimensional integrated structure, for example the highest integrated circuit. The vertical subchannels CN122 are therefore less deep than the vertical subchannels CN121. The subchannels can therefore be configured in order to make them pass in front of the hottest points of certain integrated circuits.

Figure 9:
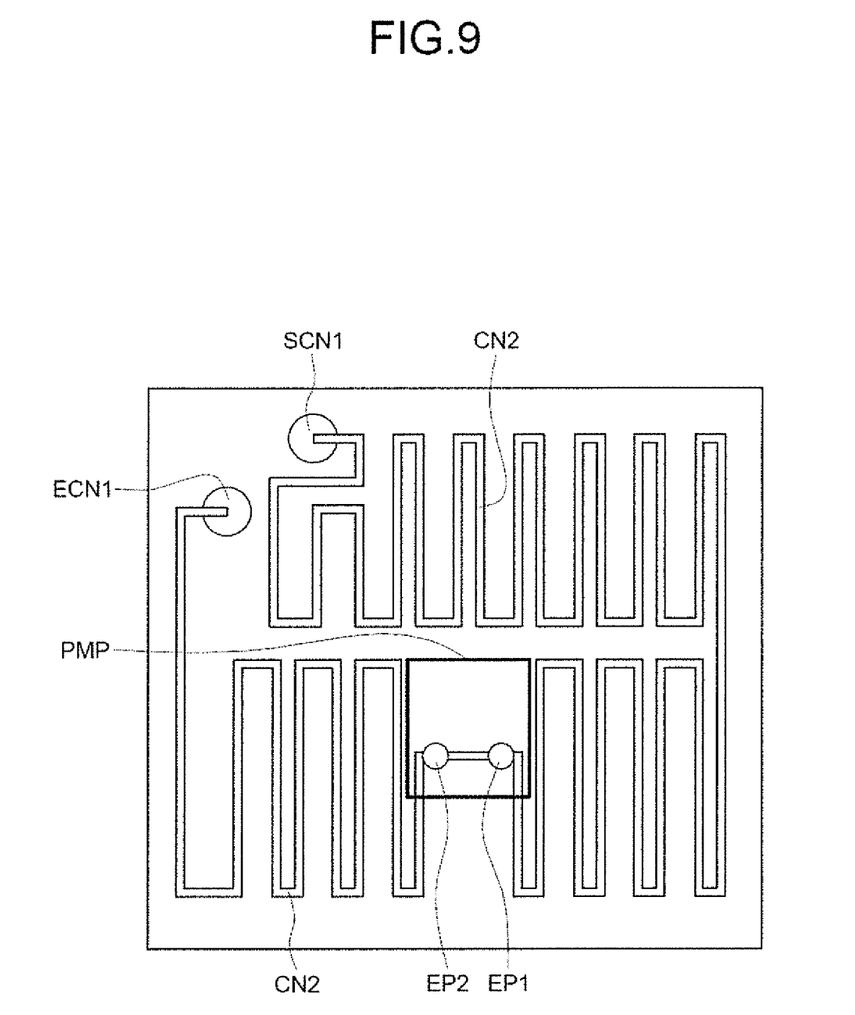
FIG. 9 is a plan view of a cap of a device according to the invention.

FIG. 9 represents a detailed plan view of an example of the path of the second channels CN2 described with reference to FIGS. 1 to 3. The channels CN2 form a serpentine between the entry point ECN1 of the first channels and the exit point SCN1 of the first channels. The second channels CN2 are furthermore in fluidic communication with the pump PMP, through an entry of the pump EP1 and through an exit of the pump EP2. It is the pump PMP which sets the fluid in circulation throughout the channels of the device.

During operation of the three-dimensional integrated structure (integrated circuit CI1 and integrated circuit CI2) and of the pump PMP, hot water is extracted from the exit point SCN1 of the first channels, and this water is cooled by passing through the second channels CN2 and through the pump PMP, which sets the fluid in circulation.

Figure 10A:
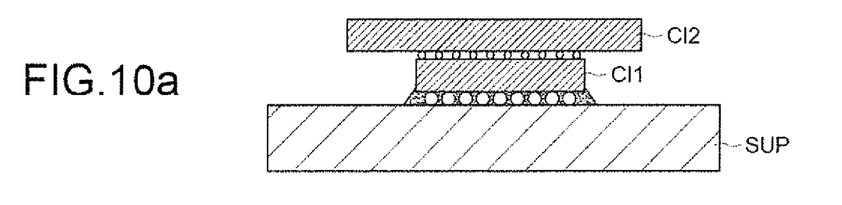
FIGS. 10a, 10b, 10c, 10d and 10e illustrate one embodiment of a method according to the invention.

FIGS. 10a to 10e illustrate in more detail the various steps of a method for producing a device according to one aspect of the invention. FIG. 10a represents the support SUP on which the integrated circuits CI1 and CI2 have been assembled according to the steps well known to the person skilled in the art, for example, by using connection beads.

Figure 10B:
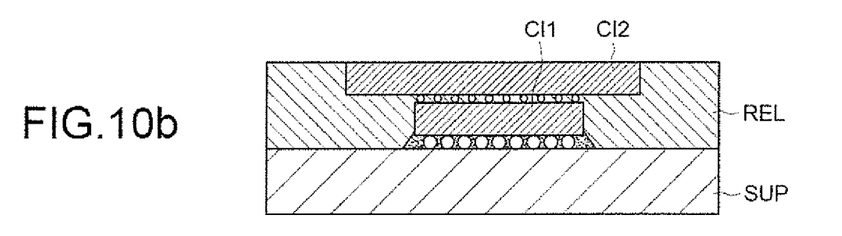

The integrated structure comprising the integrated circuits CI1 and CI2 is then encapsulated with an encapsulation region, which comprises the lateral encapsulation region REL, for example consisting of resin (FIG. 10b).

Figure 10C:
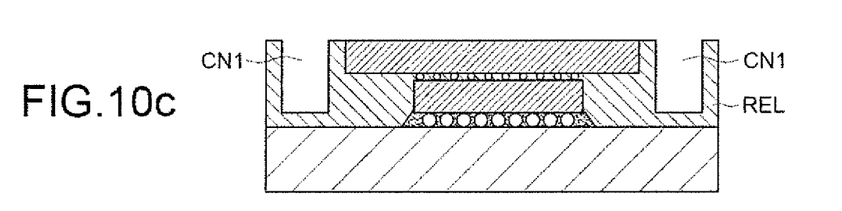

In order to form first channels CN1 in the lateral encapsulation region REL, an integrated-circuit cutting saw may be used in order to form trenches in the lateral encapsulation region REL (FIG. 10c). Alternatively, it is possible to carry out a photolithography step in order to etch the channels. The first channels CN1 may have a width of the order of 150 micrometers. It may be noted that the lateral encapsulation region REL may have a width (between the three-dimensional integrated structure and its lateral end) of the order of 350 micrometers. The depth of the first channels may, by way of indication, be of the order of 250 micrometers.

Figure 10D:
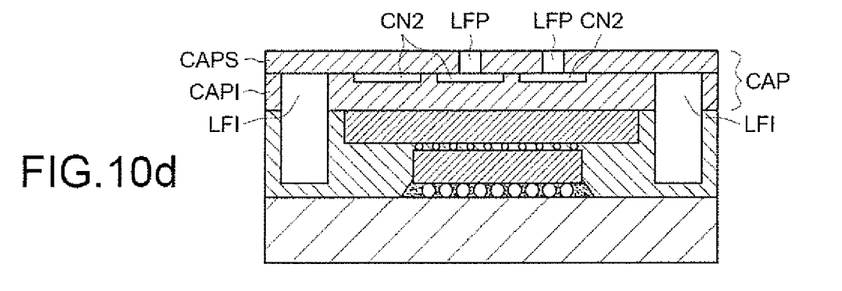
Figure 10E:
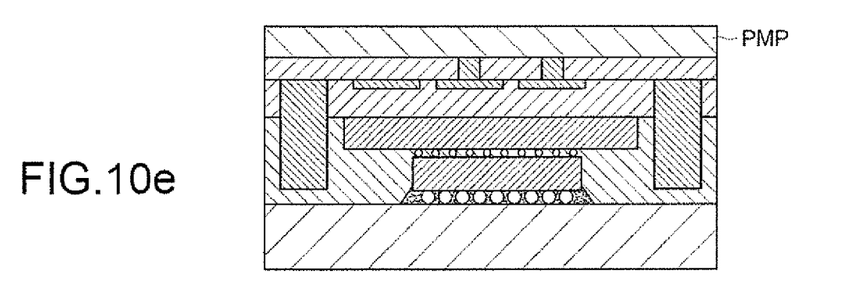

In order to seal the first channels CN1, a cap CAP is then fixed above the three-dimensional integrated structure and above the lateral encapsulation region REL, in which the first channels CN1 have been formed (FIG. 10d). The cap may have been formed beforehand by conventional steps of photolithography and etching in two silicon substrates, which are then assembled. Assembly of the cap may be carried out by using an adhesive, for example by adhesive bonding using benzocyclobutene (BOB), or a polymer marketed under the name "AIX" by the Japanese company Asahi Glass Company.

The cap CAP in this case comprises a lower cap CAPI and an upper cap layer CAPS. The lower cap layer CAPI comprises fluid connections LFI and second channels CN2. The upper cap layer CAPS comprises fluid connections LFP for connection to the pump, which extend through the entire upper cap layer CAPS to connect with a pump PMP represented in FIG. 10e.

FIGS. 11a to 11d illustrate a variant, in which buried horizontal subchannels are formed, for example, buried horizontal subchannels similar to those described with reference to FIGS. 4 to 8 and having the references CN11 or CN110.

Figure 11A:
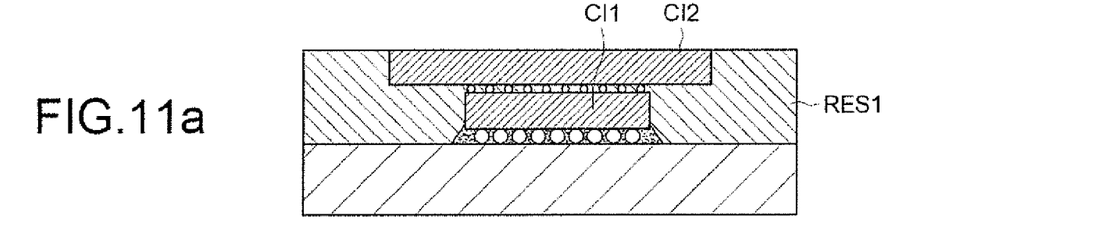
FIGS. 11a, 11b, 11c and 11d illustrate another embodiment of a method according to the invention.

In this variant, as illustrated in FIG. 11a, a first encapsulation layer RES1 is formed, for example a layer of resin, around a three-dimensional integrated structure (CI1, CI2).

Figure 11B:
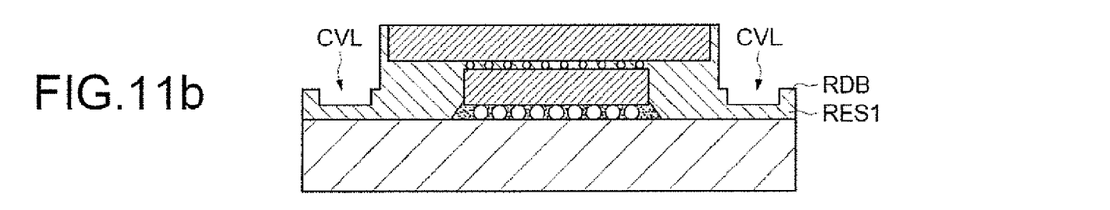

Lateral cavities CVL, which will delimit the buried horizontal subchannels, are subsequently formed in the first encapsulation layer (FIG. 11b). The lateral cavities may be produced by two photolithography steps, a first step delimiting the buried horizontal subchannel to be formed, and a second step making it possible to form lateral edges RBD which will determine the height of the buried horizontal subchannel.

Figure 11C:
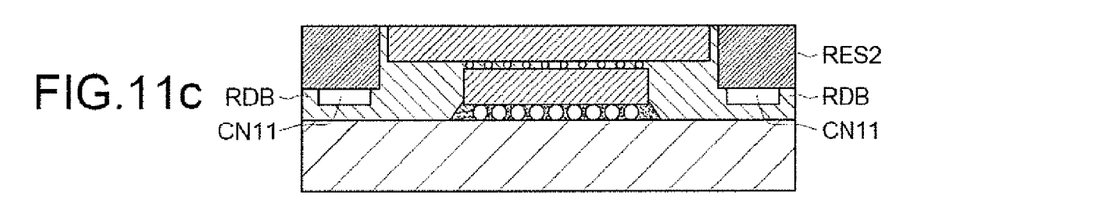

Deposition of a second encapsulation layer RES2, for example, including resin, is then carried out. The layer RES2 is not conformal, and it therefore does not fill the buried horizontal subchannel, which has the reference CN11 in this case, but rests on the edges RBD. The person skilled in the art will know how to select a resin or a material which does not sink and which is therefore not of the conformal type.

Figure 11D:
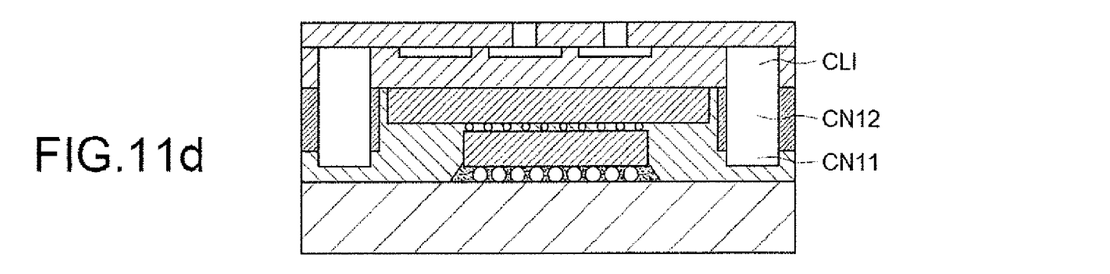

Vertical subchannels CN12 may then be formed in the second layer RES2, and a cap which comprises connecting channels CLI may be assembled (FIG. 11d). The formation of the vertical subchannels may also comprise a photolithography step.

By way of indication, the spacing between vertical subchannels may be of the order of 100 micrometers, and the vertical subchannels may have lateral dimensions of the order of 50 micrometers.

Alternatively, it is possible not to use a conformal second resin, as illustrated in the embodiment of FIGS. 12a to 12d.

Figure 12A:
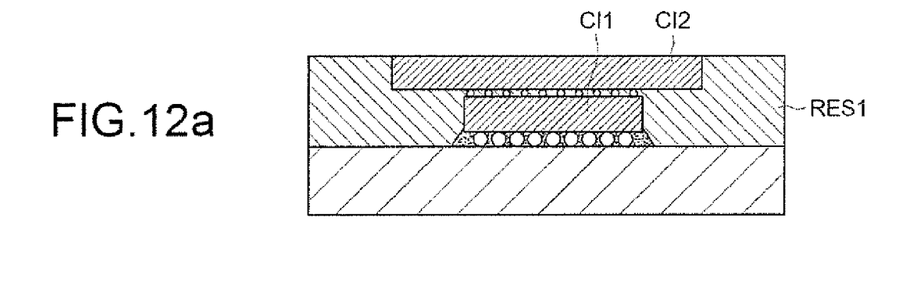
FIGS. 12a, 12b, 12c and 12d illustrate another embodiment of a method according to the invention.

In this variant, as illustrated in FIG. 12a, a first encapsulation layer RES1, for example, including resin, is formed around a three-dimensional integrated structure (CI1, CI2).

Figure 12B:
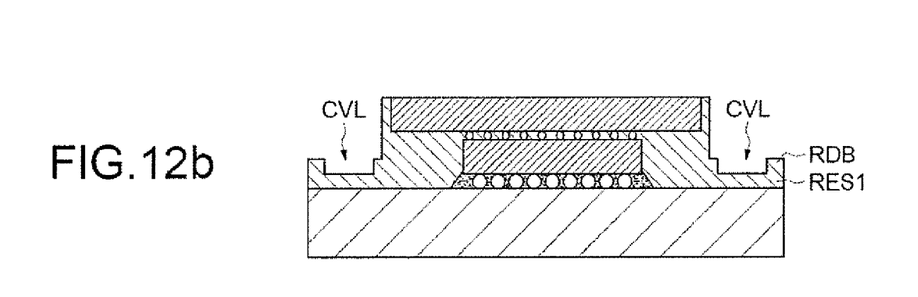

Lateral cavities CVL are subsequently formed, which will delimit the buried horizontal subchannels (FIG. 12b). The lateral cavities may be produced by two photolithography steps, a first step delimiting the buried horizontal subchannel to be formed, and a second step making it possible to form lateral edges RBD which will determine the height of the buried subchannel.

Figure 12C:
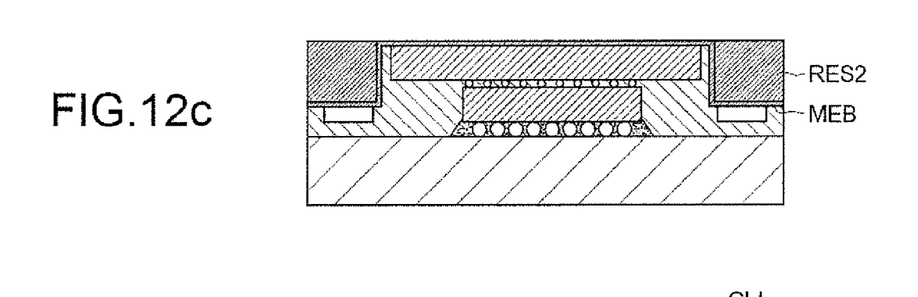

Deposition of a membrane MEB, and of a second resin layer RES2, are subsequently carried out (FIG. 12c). The use of such a membrane makes it possible to prevent the buried horizontal subchannel CN11 from being filled with the second resin layer RES2. The resin layer RES2 may therefore not be conformal.

Figure 12D:
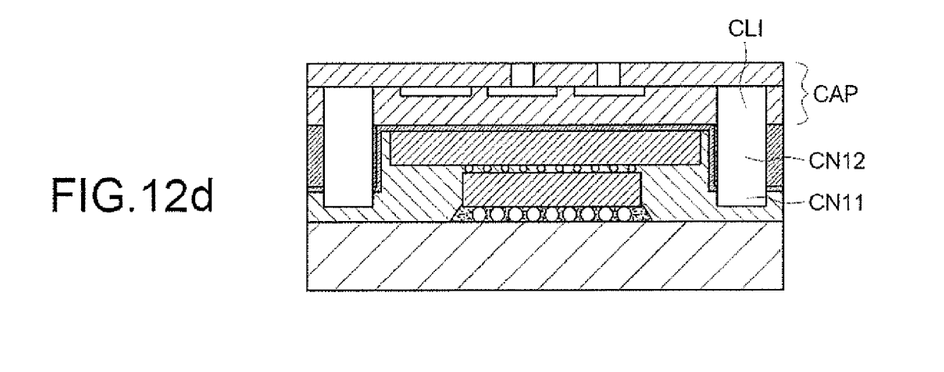

Vertical subchannels CN12 may then be formed in the second resin layer RES2 and through the membrane MEB, and a cap CAP which comprises connecting channels CLI may be assembled (FIG. 12d).

In the variant described with reference to FIGS. 13a to 13d, it is possible not to use a membrane or conformal resin.

Figure 13A:
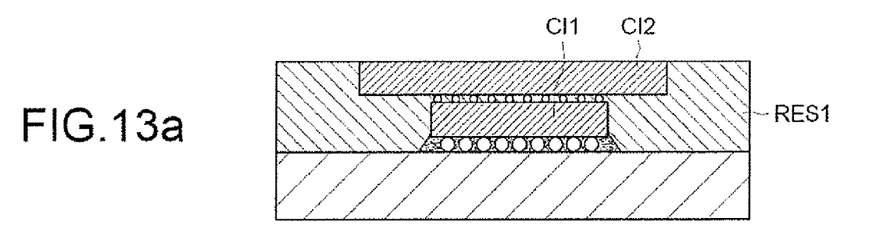
FIGS. 13a, 13b, 13c, 13d and 13e illustrate yet another embodiment of a method according to the invention.

As illustrated in FIG. 13a a first encapsulation layer RES1, for example, including resin, is formed around a three-dimensional integrated structure (CI1, CI2).

Figure 13B:
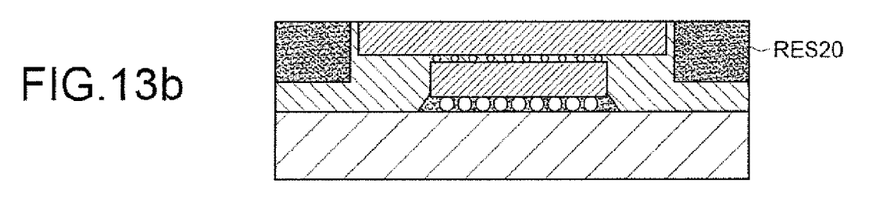

Cavities formed in the first encapsulation layer including resin RES1 are then formed, in order to fill them with resin RES 20 of the SU-8 type, as illustrated in FIG. 13b.

Figure 13C:
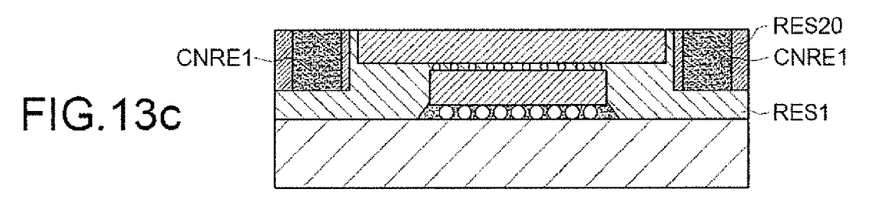

A first exposure at a selected wavelength may then be carried out in order to delimit the regions CNRE1, in which vertical and horizontal subchannels will be formed, in the resin RES 20 of the SU-8 type. The parts of SU-8 resin arranged around the regions CNRE1 are polymerized.

Figure 13D:
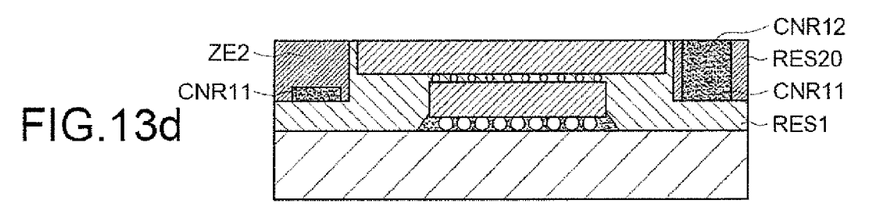

Then, as illustrated in FIG. 13d, buried horizontal subchannels may be delimited, which will be located in the unpolymerized resin regions CNR11, by exposure at another wavelength. This second exposure polymerizes the zones ZE2 above the regions CNR11. The unpolymerized resin regions CNR12, in which the vertical subchannels will be formed, are also delimited.

Figure 13E:
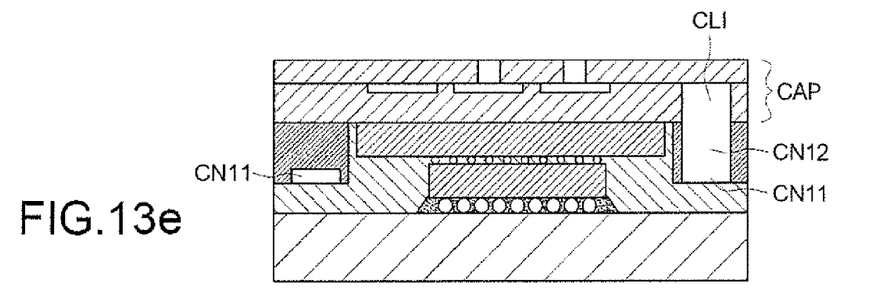

Lastly, as illustrated in FIG. 13e, a cap CAP which comprises connecting channels CLI, in fluid communication with the buried horizontal subchannels CN11 and the vertical subchannels CN12, may be assembled.

The embodiments are not limited to stacks of only two encapsulation layers, and it is also possible to form stacks of a larger number of layers in order to form more complex patterns in the lateral encapsulation regions. According to one aspect, fluidic cooling of a three-dimensional integrated structure is obtained in a simple way.

According to another aspect, redirection and better control of the heat fluxes within an integrated structure are obtained.

It may be noted that, whereas a three-dimensional integrated structure not cooled by a fluid may reach a maximum temperature of the order of 213° C. at its hottest point, or an average temperature much higher than 125° C. By arranging a single channel in the encapsulation layer it is possible to have a maximum temperature of the order of 156° C. and an average temperature of the order of 110° C. These results may be obtained by numerical analyses on the basis of a conventional three-dimensional integrated structure in operation.

It may furthermore be noted that, by attaching a channel to the integrated circuits of the three-dimensional integrated structure, cooling of the maximum temperature by of the order of 36% is obtained in comparison with a structure without channels, whereas with a channel formed directly in the three-dimensional integrated structure according to the prior art, the reduction is of the order of 42%. It may be noted that the reduction obtained by a channel in the lateral encapsulation region is good in comparison with the latter value.

Also, with a channel distant from the integrated structure, for example 1.3 millimeters away from the integrated structure, a reduction in the maximum temperature of the order of 25% is nevertheless obtained. It may be noted that, in this case, it is preferable to use a plurality of channels in order to improve the efficiency of the fluidic cooling.

Lastly, it may be noted that the use of lateral serpentine paths can make it possible to observe a significant reduction in the maximum temperature within an integrated structure.

That which is claimed:
1. A device comprising:
a support;
a three-dimensional (3D) integrated structure above the support;
a lateral encapsulation region arranged around the 3D integrated structure having a plurality of first channels therein and configured to circulate cooling fluid therethrough;

a pump in fluid communication with the plurality of first channels; and a cap above the 3D integrated structure having a plurality of second channels therein in fluid communication with the plurality of first channels.

2. The device according to claim 1, wherein the pump is in fluid communication with the plurality of first channels through the plurality of second channels.

3. The device according to claim 1, wherein the pump is arranged above the cap.

4. The device according to claim 1, wherein the cap comprises a lower cap layer and an upper cap layer defining an interface therebetween; wherein the lower cap layer has a plurality of fluid connections passing therethrough and located above portions of the plurality of first channels and communicating with the plurality of second channels; and wherein the plurality of second channels extend in the lower cap layer from the interface.

5. The device according to claim 1, wherein the second channels form a serpentine path.

6. The device according to claim 1, wherein the plurality of first channels comprises a plurality of buried horizontal subchannels and vertical subchannels; and wherein the cap has a plurality of connecting channels between the plurality of vertical subchannels so that the plurality of buried horizontal subchannels, the vertical subchannels and the connecting channels form serpentine paths.

7. The device according to claim 6, wherein the 3D integrated structure comprises a plurality of stacked integrated circuits; and wherein the plurality of buried horizontal subchannels comprises at least one buried horizontal subchannel extending in front of one of the integrated circuits and at least one buried horizontal subchannel extending in front of another of the integrated circuits.

8. The device according to claim 1, wherein the plurality of first channels comprises one buried horizontal subchannel and a plurality of vertical subchannels; and wherein the cap further comprises a connecting channel between the plurality of vertical channels.

9. The device according to claim 1, wherein the lateral encapsulation region comprises at least two superimposed resin regions.

10. The device according to claim 9, further comprising a membrane (MBB) between the at least two superimposed resin regions.

11. The device according to claim 9, wherein the resin region which lies above at least one other resin region comprises an SU-8 resin.

12. The device according to claim 1, wherein the plurality of first channels comprises a first group of first channels defining a first circuit and at least one second group of first channels defining at least one second circuit; and wherein the first circuit and the at least one second circuit form separate cooling circuits.

13. A device comprising:
a support;
a three-dimensional (3D) integrated structure adjacent the support;
an encapsulation region around the 3D integrated structure having a plurality of first channels therein to circulate cooling fluid therethrough;
a pump in fluid communication with the plurality of first channels; and
a cap above the 3D integrated structure having a plurality of second channels therein in fluid communication with the plurality of first channels.

14. The device according to claim 13, wherein the pump is in fluid communication with the plurality of first channels through the plurality of second channels.

15. The device according to claim 13, wherein the pump is arranged above the cap.

16. The device according to claim 13, wherein the encapsulation region comprises at least two superimposed resin regions.

17. The device according to claim 16, further comprising a membrane (MEB) between the at least two superimposed resin regions.

18. A method for producing a device comprising:
forming an encapsulation region around a three-dimensional (3D) integrated structure adjacent a support, the encapsulation region having a plurality of first channels therein formed by an integrated-circuit cutting saw to circulate a cooling fluid therethrough.

19. The method according to claim 18, wherein forming the encapsulation region comprises forming at least two superimposed resin regions.

20. The method according to claim 19, further comprising forming a membrane between the at least two superimposed resin regions.

21. The method according to claim 20, wherein the resin region which lies above at least one other resin region comprises an SU-8 resin.

22. The method according to claim 21, wherein two exposures of the resin regions are carried out at different wavelengths.

23. A device comprising:
a support;
a three-dimensional (3D) integrated structure adjacent the support; and
an encapsulation region around the 3D integrated structure having a plurality of first channels therein to circulate cooling fluid therethrough;
the encapsulation region comprising at least two superimposed resin regions.

24. The device according to claim 23, further comprising a membrane (MEB) between the at least two superimposed resin regions.

25. The device according to claim 23, wherein the resin region which lies above at least one other resin region comprises an SU-8 resin.

26. The device according to claim 23, wherein the 3D integrated structure comprises a plurality of stacked integrated circuits.

27. A device comprising:
a support;
a three-dimensional (3D) integrated structure adjacent the support; and
an encapsulation region around the 3D integrated structure having a plurality of first channels therein to circulate cooling fluid therethrough;
the plurality of first channels comprising a first group of first channels defining a first circuit and at least one second group of first channels defining at least one second circuit, the first circuit and the at least one second circuit forming separate cooling circuits.

28. The device according to claim 27, wherein the 3D integrated structure comprises a plurality of stacked integrated circuits.

* * * * *

UNITED STATES PATENT AND TRADEMARK OFFICE
CERTIFICATE OF CORRECTION

PATENT NO.        : 9,449,896 B2                              Page 1 of 1
APPLICATION NO.   : 14/590404
DATED             : September 20, 2016
INVENTOR(S)       : Lhostis et al.

It is certified that error appears in the above-identified patent and that said Letters Patent is hereby corrected as shown below:

Column 9, Line 44,     Delete: "(MBB)"
Claim 10               Insert --(MEB)--

Signed and Sealed this
Twenty-ninth Day of November, 2016

Michelle K. Lee
*Director of the United States Patent and Trademark Office*